(12) United States Patent
Rofougaran et al.

(10) Patent No.: US 8,334,732 B2
(45) Date of Patent: *Dec. 18, 2012

(54) METHOD AND SYSTEM FOR GENERATING QUADRATURE SIGNALS UTILIZING AN ON-CHIP TRANSFORMER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/306,575

(22) Filed: Nov. 29, 2011

(65) Prior Publication Data

US 2012/0133455 A1 May 31, 2012

Related U.S. Application Data

(63) Continuation of application No. 12/417,066, filed on Apr. 2, 2009, now Pat. No. 8,072,290.

(51) Int. Cl.
*H03H 7/32* (2006.01)
*H03H 7/42* (2006.01)

(52) U.S. Cl. .......................... 333/118; 333/25

(58) Field of Classification Search ............... 333/25, 333/26, 117, 118, 172, 177, 24 R
See application file for complete search history.

(56) References Cited

U.S. PATENT DOCUMENTS

| | | | | | |
|---|---|---|---|---|---|
| 3,419,824 | A | * | 12/1968 | Seidel | 333/24 R |
| 6,940,365 | B2 | * | 9/2005 | Kamata et al. | 333/175 |
| 8,072,290 | B2 | * | 12/2011 | Rofougaran et al. | 333/118 |
| 2007/0296519 | A1 | * | 12/2007 | Ezzeddine et al. | 333/131 |

* cited by examiner

*Primary Examiner* — Dean O Takaoka
(74) *Attorney, Agent, or Firm* — Farjami & Farjami LLP

(57) ABSTRACT

Aspects of a method and system for generating quadrature signals utilizing an on-chip transformer are provided. In this regard, a pair of phase-quadrature signals may be generated from a single-phase signal via a transformer, one or more variable capacitors, and one or more variable resistors integrated on-chip. The transformer may comprise a plurality of loops fabricated in a plurality of metal layers in the chip. Each of the one or more variable capacitors may comprise a configurable capacitor bank and each of the one or more variable resistors may comprise a configurable resistor bank. The one or more capacitor banks may be programmatically configured on-chip, based on a frequency of the single-phase signal. The one or more resistor banks may be programmatically configured on-chip, based on a frequency of said single-phase signal.

20 Claims, 7 Drawing Sheets

METHOD AND SYSTEM FOR GENERATING QUADRATURE SIGNALS UTILIZING AN ON-CHIP TRANSFORMER

CROSS-REFERENCE TO RELATED APPLICATIONS/INCORPORATION BY REFERENCE

This patent application is a continuation of U.S. application Ser. No. 12/417,066, filed Apr. 2, 2009 now U.S. Pat. No. 8,072,290. This application makes reference to U.S. patent application Ser. No. 12/397,060 filed on Mar. 3, 2009.

The above stated applications are hereby incorporated herein by reference in their entirety for all purposes.

FIELD OF THE INVENTION

Certain embodiments of the invention relate to signal processing. More specifically, certain embodiments of the invention relate to a method and system for generating quadrature signals utilizing an on-chip transformer.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for generating quadrature signals utilizing an on-chip transformer, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for generating quadrature signals utilizing an on-chip transformer. In various embodiments of the invention, a pair of phase-quadrature signals may be generated from a single-phase signal via a transformer, one or more variable capacitors, and one or more variable resistors. The transformer, one or more variable capacitors, and one or more variable resistors may be integrated on a single substrate of the chip. The transformer may comprise a plurality of loops fabricated in a plurality of metal layers in the chip. At least a portion of the plurality of loops may be coupled to one another by vias fabricated in the chip. Ferromagnetic material may be integrated in the chip at the core of the transformer. The single-phase signal may be input to a first end of a first winding of the transformer. A first signal of the pair of phase-quadrature signals may be output via a second end of the first winding of the transformer. A second signal of the pair of phase-quadrature signals may be output via a first end of a second winding of the transformer. A second end of the second winding of the transformer may be coupled to a DC bias voltage via the one or more variable resistors. The first end of the first winding may be coupled to the first end of the second winding via a first of the one or more variable capacitors. The second end of the first winding may be coupled to the second end of the second winding via a second of the one or more variable capacitors. Each of the one or more variable capacitors may comprise a configurable capacitor bank and each of the one or more variable resistors may comprise a configurable resistor bank. The one or more capacitor banks may be configured based on a frequency of the single-phase signal. The one or more capacitor banks may be programmatically configured on-chip, based on a frequency of the single-phase signal. The one or more resistor banks may be configured based on a frequency of the single-phase signal. The one or more resistor banks may be programmatically configured on-chip, based on a frequency of said single-phase signal.

Figure 1:
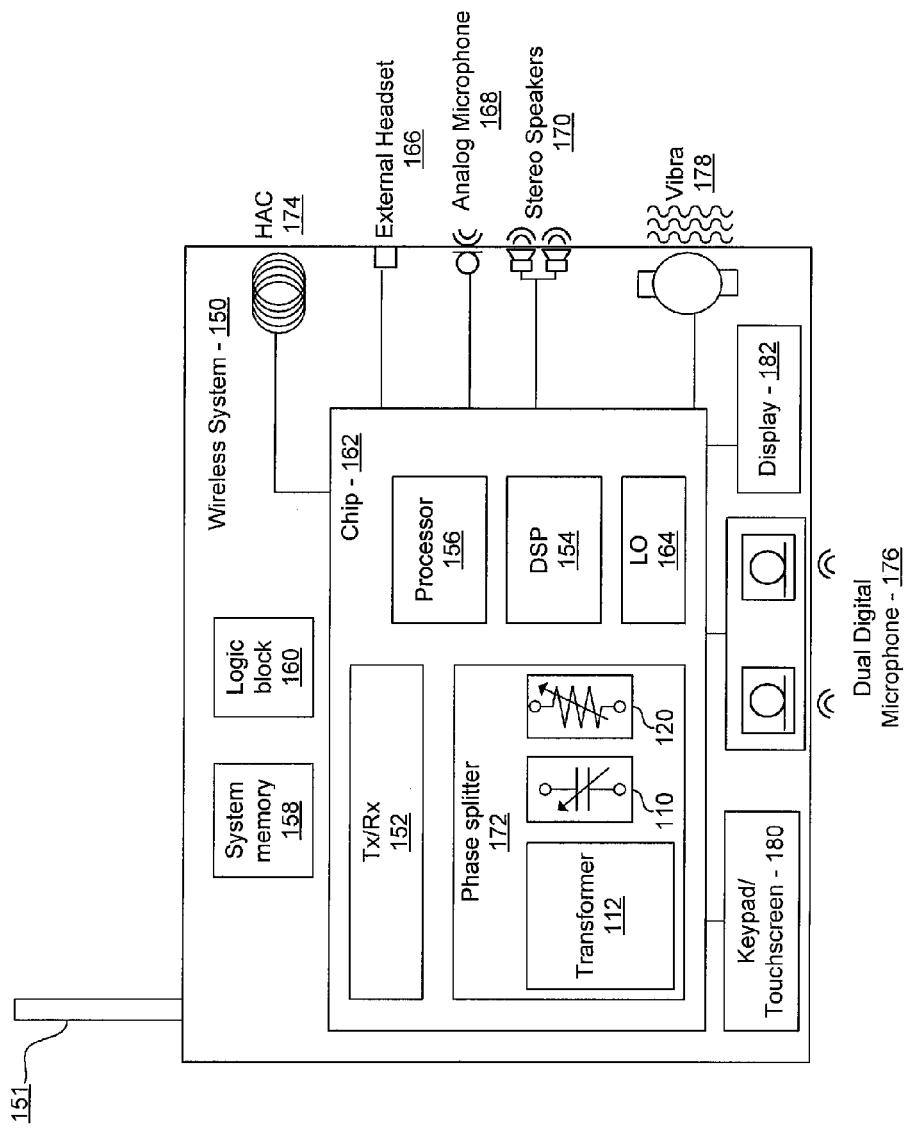
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a system memory 158, a logic block 160, a chip 162, an analog microphone 168, integrated hands-free (IHF) stereo speakers 170, a hearing aid compatible (HAC) coil 174, a dual digital microphone 176, a vibration transducer 178, a keypad and/or touchscreen 180, a display 182, and a chip 162.

The chip 162 may comprise an integrated circuit with multiple functional blocks integrated within, such as a transmitter and/or receiver (Tx/Rx) 152, a DSP 154, a processor 156, a local oscillator (LO) 164, and a phase splitter 172. The number of functional blocks integrated in the chip 162 is not limited to the number shown in FIG. 1. Accordingly, any number of blocks may be integrated on the chip 162 depending on chip space and wireless device 150 requirements, for example.

The Tx/Rx 152 may comprise suitable logic, circuitry, interface, and/or code that may be enabled to modulate, upconvert, amplify, and/or otherwise process baseband signals to generate RF signals for transmission. The Tx/Rx 152 may also be enabled to amplify, downconvert, demodulate, and/or otherwise process received RF signals to recover baseband signals. In this regard, processing to-be-transmitted and/or received signals may utilize one or more reference signals generated via the local oscillator (LO) 164 and/or the phase splitter 172. RF signals may be transmitted and/or received via one or more antennas, which may be represented generically by the antenna 151. Although a single Tx/Rx 152 is shown, the invention is not so limited. Accordingly, the Tx/Rx 152 may be implemented as a separate transmitter and a separate receiver. In addition, there may be a plurality of transmitters and/or receivers. In this regard, the plurality of transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZIGBEE, for example.

The processor 156 may comprise suitable logic, circuitry, interfaces, and/or code that may enable processing data and/or controlling operations of the wireless system 150. In this regard, the processor 156 may be enabled to provide control signals to one or more of components of the chip 162 and/or one or more components of the wireless system 150 not integrated on the chip 162. The processor 156 may also control transfers of data between various portions of the chip 162 and the wireless system 150. Additionally, the processor 156 may enable execution of applications, programs, and/or code. In various embodiments of the invention, the applications, programs, and/or code may enable, for example, generating to-be-transmitted data and/or processing received data. In various embodiments of the invention, the processor 154 may be operable to generate control signals for the LO 164 and/or the phase splitter 172 to generate phase-quadrature signals. In this regard, the processor 156 may be operable to configure the LO 164, the variable capacitor 110, and/or the variable resistor 120, based on a transmit and/or receive frequency.

The DSP 162 may comprise suitable logic, circuitry, interfaces, and/or code operable to perform computationally intensive processing of received and/or to-be-transmitted data. In various embodiments of the invention, the DSP 162 may encode, decode, transcode, modulate, demodulate, encrypt, decrypt, scramble, descramble, and/or otherwise process data. In some embodiments of the invention, the DSP 162 may be operable to detect a frequency of a signal and generate an indication of the detected frequency. In this regard, the frequency indication may be utilized to configure the LO 164 and/or the phase splitter 172 for generating phase-quadrature signals.

The local oscillator (LO) 164 may comprise suitable logic, circuitry, interfaces, and/or code that may be operable to generate one or more reference signals. In this regard, one or more frequencies output by the LO 164 may be configurable and may be controlled based on, for example, transmit and/or receive frequencies of the Tx/Rx 152. Furthermore, the LO 164 may comprise a phase splitter 172 operable to generate one or more pairs of phase-quadrature signals via a transformer 112, one or more variable capacitors 110, and one or more variable resistors 120.

The transformer 112 may comprise multiple windings wrapped, or substantially surrounding a transformer core. In various embodiments of the invention, the loops of the winding may be realized in metal layers of the chip 162 and the metal layers may be separated by insulating material such as silicon dioxide. In various embodiments of the invention, the transformer core may comprise ferromagnetic material.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of programmable parameters and/or data structures, such as a look-up-table, that may be utilized by the processor 156 to control operations of the wireless system 150.

The logic block 160 may comprise suitable logic, circuitry, interface(s), and/or code that may enable controlling of various functionalities of the wireless device 150. For example, the logic block 160 may comprise one or more state machines that may generate signals to control the Tx/Rx 152, the processor 156, the DSP 154, and/or the LO 164. The logic block 160 may also comprise registers that may hold data for controlling, for example, the Tx/Rx 152, the processor 156, the DSP 154, and/or the LO 164. The logic block 160 may also generate and/or store status information that may be read by, for example, the processor 156.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The stereo speakers 170 may comprise a pair of speakers that may be operable to generate audio signals from electrical signals. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

The keypad and/or touchscreen 180 may comprise suitable, logic, circuitry, interfaces, and/or code that may enable a user of the wireless system 150 to input numerical and/or textual information.

In operation, the wireless system 150 may transmit and/or receive signals. With regard to signal transmission, data and/or content to be transmitted may, for example, be generated via one of the inputs to the wireless system 150, read out of the system memory 158, and/or generated by the processor 156 or DSP 154. Baseband signals comprising information to be transmitted may be conveyed to the Tx/Rx 152 for upconversion and transmission. With regard to signal reception, received signals may be downconverted to baseband and the baseband. The baseband signals may, for example, be conveyed to one or more outputs of the wireless system 150 for presentation to a user and/or may be stored to the system memory 158.

Accordingly, one or more reference signals for converting between RF and baseband, and/or for implementing other functions within the wireless system 150, may be generated by the LO 164. In some instances, pairs of phase-quadrature reference signals may be desired and/or required for a frequency conversion. In such instances, a single-phase signal may be routed through the phase splitter 172 to generate a pair of phase-quadrature signals. The single-phase signal may, for example, be generated by the LO 164 and/or may be recovered from a received signal.

The frequency response and/or behavior of the phase splitter may depend on the capacitance of the variable capacitor 110 and/or the resistance of the variable resistor 120. Accordingly, to support a range of frequencies, the variable capacitor 110 and/or variable resistor 120 may be adjusted based on the frequency of the signal input to the phase splitter 172. In this regard, one or more signals that control the capacitance of the variable capacitor 110 and/or the resistance of the variable resistor 120 may be programmatically controlled by the Tx/Rx 152, the processor 156, and/or the DSP 154. For example, the processor 156 may determine a transmit and/or a receive frequency and may configure the LO 164, the Tx/Rx 152, and the phase splitter 172 accordingly. In this regard, the processor 156 may be operable to determine a transmit and/or a receive frequency based, for example, on a channel and/or wireless protocol in use. The processor 156 may be operable to determine an appropriate configuration of one or more control signals utilizing, for example, a look-up table stored in the system memory 158.

Figure 2A:
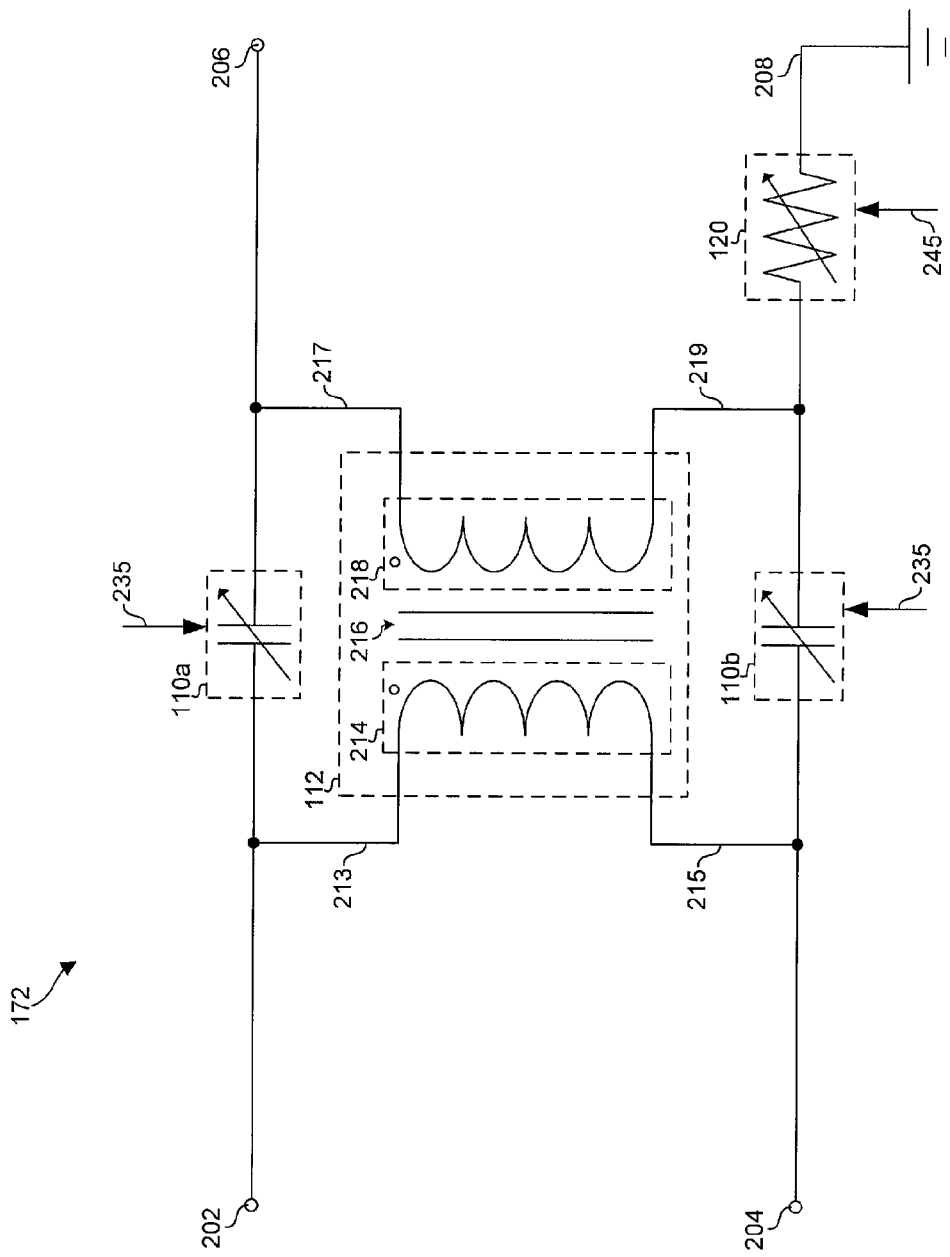
FIG. 2A is a circuit diagram illustrating an integrated phase splitter, in accordance with an embodiment of the invention.

FIG. 2A is a circuit diagram illustrating an integrated phase splitter, in accordance with an embodiment of the invention. Referring to FIG. 2A, the phase splitter 172 may comprise a transformer 112, variable capacitors 110a and 110b, and variable resistor 120.

The transformer 112 may be as described with respect to FIG. 1 and additional details of an exemplary integrated transformer are described below with respect to FIGS. 3A and 3B. The transformer 112 may comprise a first winding 214, a second winding 218, and a core 216. A first end 213 of the first winding 214 may be coupled to the input 202 and to a first terminal of the variable capacitor 110a. A second end 215 of the first winding 214 may be coupled to the output 204 and to a first terminal of the variable capacitor 110b. A first end 217 of the second winding 218 may be coupled to the output 206 and to a second terminal of the variable capacitor 110a. A second end 219 of the second winding 218 may be coupled to a second terminal of the variable capacitor 110b and to a first terminal of the variable resistor 120. A second terminal of the variable resistor 120 may be coupled to ground or another DC voltage.

The variable capacitors 110a and 110b may be configured utilizing a control signal 235, which may comprise, for example, a plurality of analog and/or digital voltages. In an exemplary embodiment of the invention, the control signal 235 may be a digital control word.

The variable resistor 120 may be configured utilizing a control signal 245, which may comprise, for example, a plurality of analog and/or digital voltages. In an exemplary embodiment of the invention, the control signal 245 may be a digital control word.

In operation, a single-phase signal may be applied to the input 202 and a pair of phase-quadrature signals may be generated at the outputs 204 and 206. The signal generated at output 206 may be in-phase with the input signal and the signal generated at the output 204 may be 90° out-of-phase with the input signal. Since the behavior of the outputs may be frequency dependent, the signals 235 and 245 may be configured based on the frequency of the input signal.

Figure 2B:
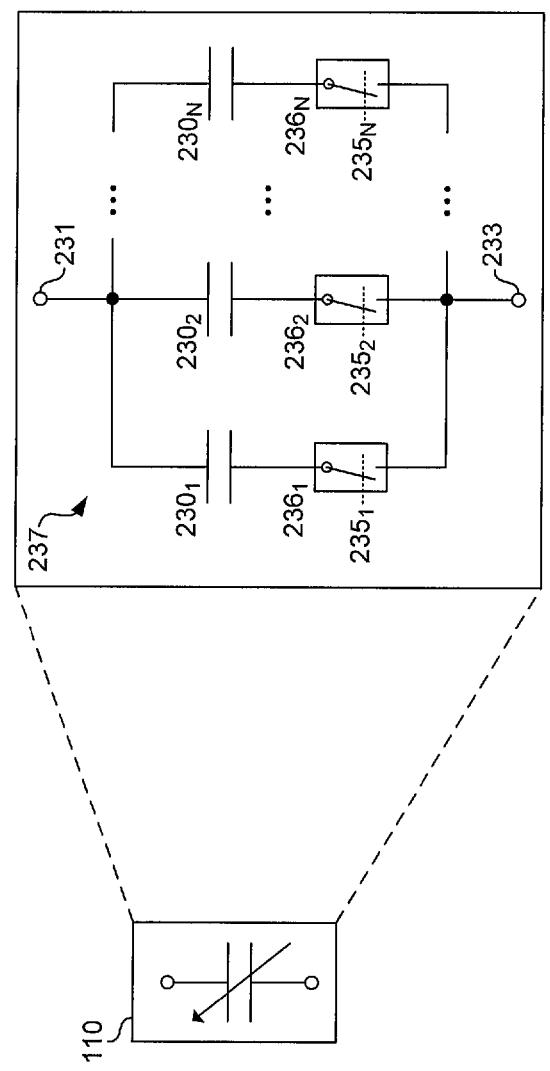
FIG. 2B is a circuit diagram illustrating an exemplary variable capacitor comprising a configurable capacitor bank, in accordance with an embodiment of the invention.

FIG. 2B is a circuit diagram illustrating an exemplary variable capacitor comprising a configurable capacitor bank, in accordance with an embodiment of the invention. Referring to FIG. 2B, the capacitor bank 237 may comprise a plurality of capacitive elements $230_1, \ldots, 230_N$, and a plurality of switching elements $236_1, \ldots, 236_N$, where N is an integer. The capacitive elements $230_1, \ldots, 230_N$ may, for example, be realized in one or more metal layers of the chip 162. The switching elements may comprise, for example, transistors realized in a substrate of the chip 162.

In operation, the capacitance between the terminals 231 and 233 may be adjusted by controlling which of the switching elements $236_1, 236_N$ are open and which are closed. In this regard, the switching elements $236_1, \ldots, 236_N$ may be programmatically controlled by the signal 235. In an exemplary embodiment of the invention, the signal 235 may be a digital word and each bit $235_X$ of the control word may control a corresponding switching element $236_X$, where X is an integer between 1 and N. In various exemplary embodiment of the invention, each of the capacitive elements $236_1, \ldots, 236_N$ may be of the same unit capacitance, or the capacitance may be binary weighted such that the capacitance of the capacitive element $230_X$ is equal to $C_U^X$, where $C_U$ is a unit capacitance.

Figure 2C:
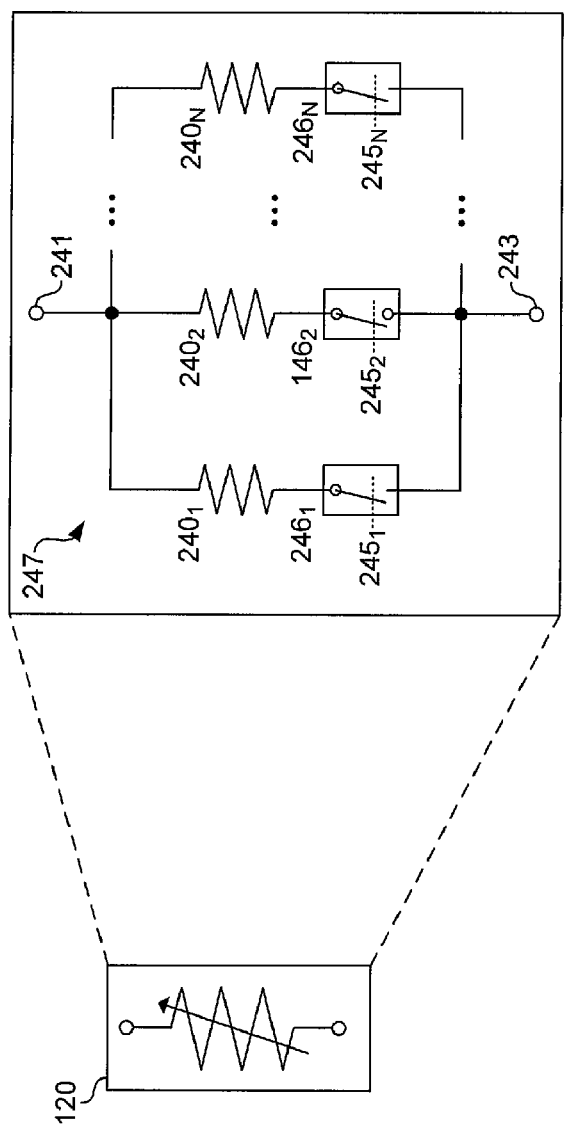
FIG. 2C is a circuit diagram illustrating an exemplary variable resistor comprising a configurable resistor bank, in accordance with an embodiment of the invention.

FIG. 2C is a circuit diagram illustrating an exemplary variable resistor comprising a configurable resistor bank, in accordance with an embodiment of the invention. Referring to FIG. 2C, the resistor bank 247 may comprise a plurality of resistive elements $240_1, \ldots, 240_N$, and a plurality of switching elements $246_1, \ldots, 246_N$, where N is an integer. The resistive elements $240_1, \ldots, 240_N$ may, for example, be realized in polysilicon and/or in a substrate of the chip 162. The switching elements may comprise, for example, transistors realized in a substrate of the chip 162.

In operation, the resistance between the terminals 241 and 243 may be adjusted by controlling which of the switching elements $246_1, \ldots, 246_N$ are open and which are closed. In this regard, the switching elements $246_1, \ldots, 246_N$ may be programmatically controlled by the signal 245. In an exemplary embodiment of the invention, the signal 245 may be a digital word and each bit $245_X$ of the control word may control a corresponding switching element $246_X$, where X is an integer between 1 and N. In various exemplary embodiments of the invention, each of the resistive elements $246_1, \ldots, 246_N$ may be of the same unit resistance, or the resistance may be binary weighted such that the capacitance of the capacitive element $240_X$ is equal to $R_U^X$, where $R_U$ is a unit capacitance.

Figure 3A:
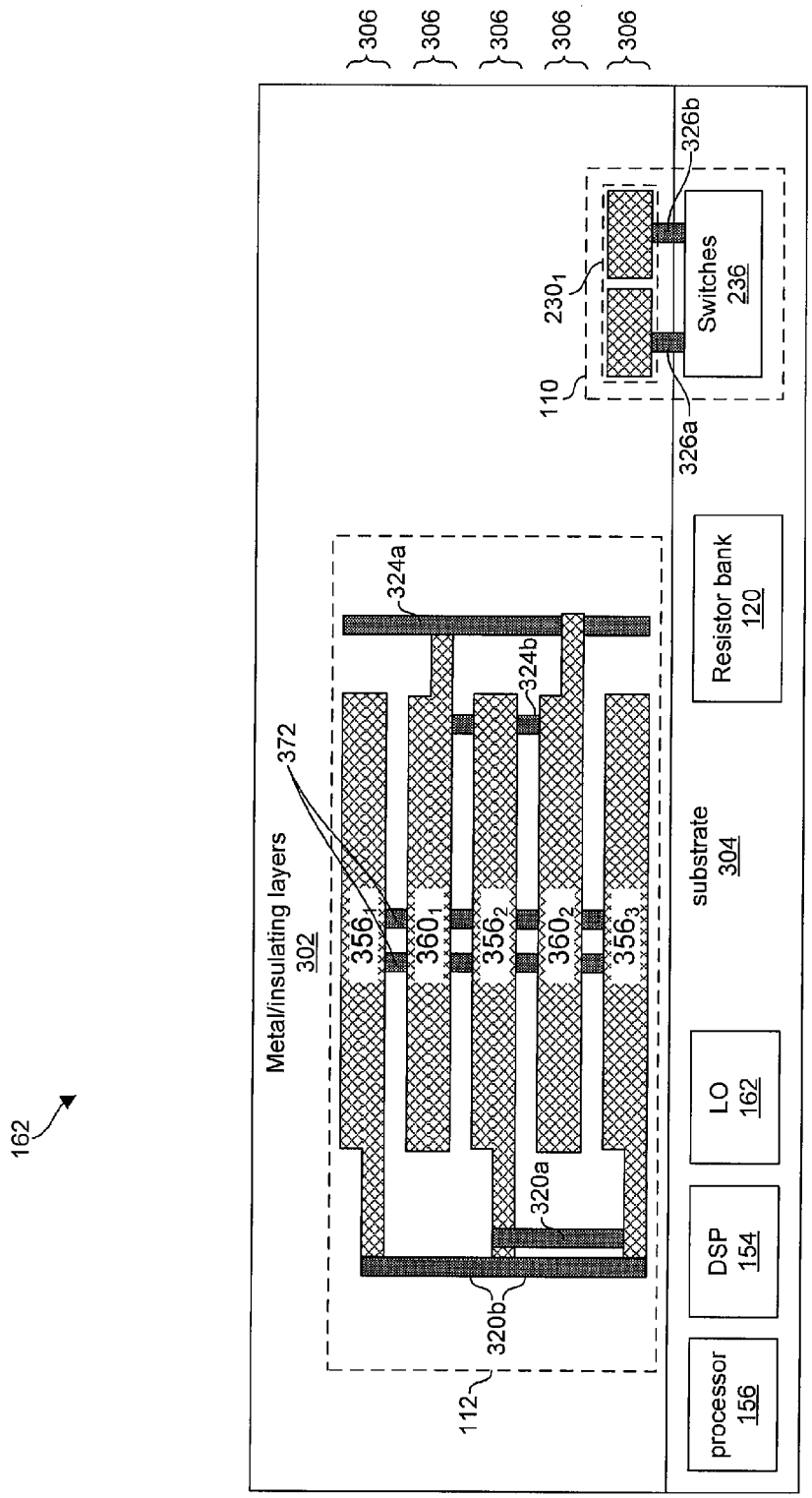
FIG. 3A is a diagram illustrating a cross sectional view of an integrated circuit comprising a transformer, in accordance with an embodiment of the invention.

FIG. 3A is a diagram illustrating a cross sectional view of an integrated circuit comprising a transformer, in accordance with an embodiment of the invention. Referring to FIG. 3A, there is shown an integrated circuit (IC), "chip," 162 comprising metal/insulating layers 302, substrate 304, and vias 320, 324, and 326. At least a portion of the transformer 112 and the variable capacitor 110 may be realized in the metal/insulating layers 302 integrated on the substrate 304. At least a portion of the variable capacitor 110 and the variable resistor 120 may be integrated within the substrate 304. Additionally, in various embodiments of the invention, the IC 306 may comprise one or more layers and/or areas of ferromagnetic and/or ferrimagnetic material.

In various embodiments of the invention, the chip 162 may be bump-bonded or flip-chip bonded to a multi-layer chip package (not shown). In this manner, wire bonds connecting the chip 162 to the multi-layer chip package may be eliminated, reducing and/or eliminating uncontrollable stray inductances due to wire bonds. In addition, the thermal conductance out of the chip 162 may be greatly improved utilizing solder balls (not shown) and thermal epoxy (not shown). The thermal epoxy may be electrically insulating but thermally conductive to allow for thermal energy to be conducted out of the chip 162 to the much larger thermal mass of a multi-layer package.

The metal/insulating layers 302 may comprise five metal layers 306; however, the invention is not so limited. The metal layers 306 may each comprise a deposited metal layer utilized to delineate the two windings 356 (comprised of loops $356_1$, $356_2$, and $356_3$) and 360 (comprised of loops $360_1$, $360_2$) of the transformer 212. The metal layers may also be utilized to delineate portions of a transformer core (portions 370 shown in FIG. 3B), and vias 372 may couple the portions of the core. In this regard, the metal layers 306 may be deposited in shapes and/or sizes which enable varying characteristics of the transformer 112. Additionally, one or more metal layers 306 may comprise a deposited metal layer utilized to delineate capacitive elements of one or more variable capacitors 110. In this regard, the number, shape, and/or size of the deposited areas may determine capacitance and/or other characteristics of the variable capacitor 110.

The vias 320, 324, 326, and 362 may comprise metal and/or other conductive material(s) which may communicatively couple the metal layers 306 to one another and/or to other logic and/or circuitry in the chip 162. The vias 320, 324, and 326 may enable signals to be conveyed to and/or from the transformer windings 356 and 360. The vias 326 may enable signals to be conveyed to and/or from the capacitive elements $230_1, \ldots, 230_N$.

The substrate 304 may comprise, for example, one or more layers of a semiconductor material such as silicon. In an exemplary embodiment of the invention, at least a portion of each of the Tx/Rx 152, the processor 156, the DSP 154, the LO 164, and/or the phase splitter 172 may be realized in, for example, CMOS circuitry in the substrate 304.

In operation, the IC 306 may process signals that are to be transmitted and/or received in order to support wireless communication. In instances that processing of signals requires generating a pair of phase-quadrature signals from a single-phase signal, the processor 156 may generate one or more control signals to configure one or more active devices in the substrate 304 to configure the LO to generate the single-phase signal, to route the single-phase signal through the transformer 112, and to configure the capacitor bank(s) 110 and the resistor bank 120.

In various embodiments of the invention, additional devices (e.g., transistors, capacitors, inductors, resistors) may be integrated into the chip 306 without deviating from the scope of the present invention. Additionally, although a transformer comprising five loops is depicted, various embodiments of the invention may comprise any number of metal layers, transformer loops, switching elements, etc. without deviating from the scope of the invention.

Figure 3B:
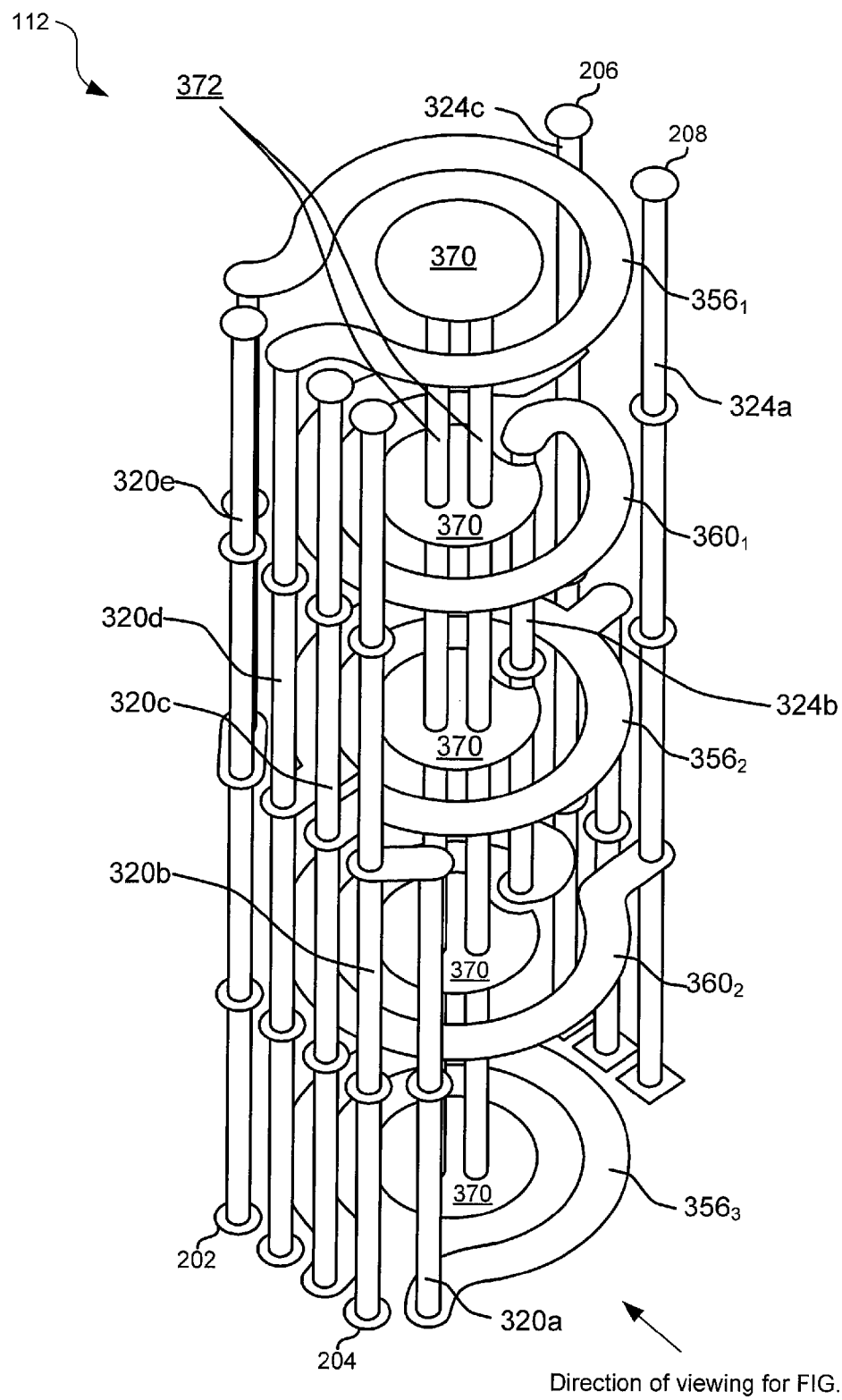
FIG. 3B is an exemplary three dimensional view of an integrated circuit transformer, in accordance with an embodiment of the invention.

FIG. 3B is an exemplary three dimensional view of an integrated circuit transformer, in accordance with an embodiment of the invention. Referring to FIG. 2B, there is shown a 3-D view of an embedded transformer similar to or the same as the multi-tap transformer 112 described with respect to FIGS. 1, 2A, 2B, and 3A. In the exemplary embodiment of the invention depicted, primary windings of FIG. 2A may be comprise loops $356_1$, $356_2$, and $356_3$ and the output windings of FIG. 2A may comprise loops $360_1$ and $360_2$. A core of the transformer 112 may comprise portions 360 of the metal layers and vias 362. In some embodiments of the invention, the portions 360 and/or the vias 362 may comprise ferromagnetic material. In the exemplary embodiment of the invention depicted, inputs and/or outputs 202, 204, 206, and 208; vias 320a-320e, and vias 324a-324c are labeled. Although the primary windings may show three turns, FIG. 3B demonstrates an exemplary embodiment and the invention is not so limited.

Figure 4:
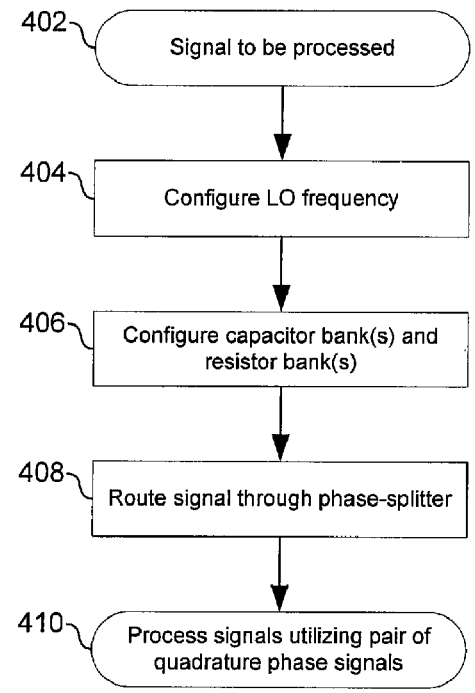
FIG. 4 is a flowchart illustrating exemplary steps for generating a phase-quadrature signals via an on-chip configurable phase splitter comprising an on-chip transformer, in accordance with an embodiment of the invention.

FIG. 4 is a flowchart illustrating exemplary steps for generating a phase-quadrature signals via an on-chip configurable phase splitter comprising an on-chip transformer, in accordance with an embodiment of the invention. The exemplary steps that are illustrated in FIG. 4 are described with respect to the exemplary wireless system 150 of FIG. 1. Referring to FIG. 4, the exemplary steps may begin with step 402 when operations of the wireless system 150 require quadrature upconversion and/or quadrature downconversion of a signal. Subsequent to step 402, the exemplary steps may advance to step 404.

In step 404, the processor 156 may generate one or more control signals to configure the LO 164 to generate a reference frequency for the upconversion and/or downconversion. In this regard, the LO 164 may generate a single-phase LO signal. Subsequent to step 404, the exemplary steps may advance to step 406.

In step 406, the processor 156 may generate one or more control signals to configure the one or more variable capacitors 110 and/or the one or more variable resistors 120 based on the frequency of the single-phase LO signal. Subsequent to step 406, the exemplary steps may advance to step 408.

In step 408, the processor 156 may generate one or more control signals to route the single-phase LO signal to a first end of a first winding of the on-chip transformer 112. Additionally, a second end of the first winding and a first end of a second winding of the transformer 112 may be communicatively coupled to the portion of the chip 162 performing the upconversion and/or downconversion. Subsequent to step 408, the exemplary steps may advance to step 410.

In step 410, the pair of phase-quadrature signals output by the transformer may be utilized to quadrature upconvert and/or downconvert the received and/or to-be-transmitted signal.

Aspects of a method and system for generating quadrature signals utilizing an on-chip transformer are provided. In an exemplary embodiment of the invention, a pair of phase-quadrature signals may be generated from a single-phase signal via a transformer 112, one or more variable capacitors 110, and one or more variable resistors 120. The transformer, one or more variable capacitors, and one or more variable resistors are integrated on a single substrate of the chip 162. The transformer 112 may comprise a plurality of loops 356 and 360 fabricated in a plurality of metal layers 306 in the chip 162. At least a portion of the plurality of loops 356 and 360 may be coupled to one another by vias 320 and 324 fabricated in the chip 162. Ferromagnetic material may be integrated in the chip at the core 216 of the transformer 112. The single-phase signal may be input to a first end 213 of a first winding 214 of the transformer 112. A first signal of the pair of phase-quadrature signals may be output via a second end 215 of the first winding 214 of the transformer 112. A second signal of the pair of phase-quadrature signals may be output via a first end 217 of a second winding 218 of the transformer 112. A second end 219 of the second winding 218 of the transformer 112 may be coupled to a DC bias voltage via the one or more variable resistors 120. The first end 213 of the first winding 214 may be coupled to the first end 217 of the second winding 218 via a first of the one or more variable capacitors 110a. The second end 214 of the first winding 214 may be coupled to the second end 219 of the second winding 218 via a second of the one or more variable capacitors 110b. Each of the one or more variable capacitors 110 may comprise a configurable capacitor bank 237 and each of the one or more variable resistors 120 may comprise a configurable resistor bank 247. The one or more capacitor banks 237 may be configured based on a frequency of the single-phase signal. The one or more capacitor banks 237 may be programmatically configured on-chip, based on a frequency of the single-phase signal. The one or more resistor banks 247 may be configured based on a frequency of the single-phase signal. The one or more resistor banks 247 may be programmatically configured on-chip, based on a frequency of said single-phase signal.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for generating quadrature signals utilizing an on-chip transformer.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
receiving a single-phase signal; and
generating a pair of phase-quadrature signals from a single-phase signal via an integrated circuit comprising a transformer, one or more variable capacitors, and one or more variable resistors;
wherein a first end of a first winding of said transformer is coupled to a first end of a second winding of said transformer via a first of said one or more variable capacitors, and a second end of said first winding is coupled to a second end of said second winding via a second of said one or more variable capacitors.

2. The method according to claim 1, wherein the transformer comprises a plurality of loops fabricated in a plurality of metal layers in the integrated circuit.

3. The method according to claim 2, wherein at least a portion of the plurality of loops is coupled by vias fabricated in the integrated circuit.

4. The method according to claim 1, wherein:
said single-phase signal is input to said first end of said first winding of said transformer;
a first signal of said pair of phase-quadrature signals is output via said second end of said first winding of said transformer;
a second signal of said pair of phase-quadrature signals is output via said first end of said second winding of said transformer;
said second end of said second winding of said transformer is coupled to a DC bias voltage via said one or more variable resistors.

5. The method according to claim 1, wherein each of the one or more variable capacitors comprises a configurable capacitor bank and each of the one or more variable resistors comprises a configurable resistor bank.

6. The method according to claim 5, wherein the method comprises configuring the one or more capacitor banks based on a frequency of the single-phase signal.

7. The method according to claim 6, wherein the method comprises programmatically configuring, on the integrated circuit, the one or more capacitor banks based on a frequency of the single-phase signal.

8. The method according to claim 7, wherein the method comprises configuring the one or more resistor banks based on a frequency of the single-phase signal.

9. The method according to claim 8, comprising programmatically configuring, on the integrated circuit, the one or more resistor banks based on a frequency of the single-phase signal.

10. A system for signal processing, the system comprising:
an integrated circuit comprising:
a transformer;
one or more variable capacitors;
one or more variable resistors;

a circuit operable to generate a pair of phase-quadrature signals from a single-phase signal via said transformer, said one or more variable capacitors, and said one or more variable resistors;

wherein a first end of a first winding of said transformer is coupled to a first end of a second winding of said transformer via a first of said one or more variable capacitors, and a second end of said first winding is coupled to a second end of said second winding via a second of said one or more variable capacitors.

11. The system according to claim 10, wherein the transformer comprises a plurality of loops fabricated in a plurality of metal layers in the integrated circuit.

12. The system according to claim 11, wherein two or more of the plurality of loops are coupled to one another by vias fabricated in the integrated circuit.

13. The system according to claim 10, wherein ferromagnetic material is integrated in the integrated circuit at the core of the transformer.

14. The system according to claim 10, wherein:
said single-phase signal is input to said first end of said first winding of said transformer;
a first signal of said pair of phase-quadrature signals is output via said second end of said first winding of said transformer;
a second signal of said pair of phase-quadrature signals is output via said first end of said second winding of said transformer;
said second end of said second winding of said transformer is coupled to a DC bias voltage via said one or more variable resistors.

15. The system according to claim 10, wherein each of the one or more variable capacitors comprises a configurable capacitor bank and each of the one or more variable resistors comprises a configurable resistor bank.

16. The system according to claim 15, wherein the circuit is operable to configure the one or more capacitor banks based on a frequency of the single-phase signal.

17. The system according to claim 16, wherein the circuit is operable to programmatically configure, on the integrated circuit, the one or more capacitor banks based on a frequency of the single-phase signal.

18. The system according to claim 15, wherein the circuit is operable to configure the one or more resistor banks based on a frequency of the single-phase signal.

19. The system according to claim 18, wherein the circuit is operable to programmatically configure, on the integrated circuit, the one or more resistor banks based on a frequency of the single-phase signal.

20. An integrated circuit for generating a pair of phase-quadrature signals, the integrated circuit comprising:
a transformer operable to:
receive a single-phase signal at a first end of a first winding of the transformer;
output a first signal of the pair of phase-quadrature signals via a second end of the first winding of the transformer; and
output a second signal of the pair of phase-quadrature signals via a first end of a second winding of the transformer;
a first variable capacitor coupled between the first end of the first winding and the first end of the second winding;
a second variable capacitor coupled between the second end of the first winding and the second end of the second winding; and
one or more variable resistors coupled between the second end of the second winding of the transformer and a DC bias voltage.

* * * * *